(12) United States Patent
Pao et al.

(10) Patent No.: US 11,924,986 B2
(45) Date of Patent: Mar. 5, 2024

(54) ELECTRONIC DEVICE AND UNLOCKING COVER THEREOF

(71) Applicant: WISTRON NEWEB CORPORATION, Hsinchu (TW)

(72) Inventors: Szu-Cheng Pao, Hsinchu (TW); Yu-Shuo Wu, Hsinchu (TW)

(73) Assignee: WISTRON NEWEB CORPORATION, Hsinchu (TW)

(*) Notice: Subject to any disclaimer, the term of this patent is extended or adjusted under 35 U.S.C. 154(b) by 114 days.

(21) Appl. No.: 17/488,401

(22) Filed: Sep. 29, 2021

(65) Prior Publication Data

US 2022/0408575 A1 Dec. 22, 2022

(30) Foreign Application Priority Data

Jun. 21, 2021 (TW) ................................ 110122508

(51) Int. Cl.
*H05K 5/02* (2006.01)
*H01R 13/428* (2006.01)
*H05K 5/00* (2006.01)

(52) U.S. Cl.
CPC ......... *H05K 5/0221* (2013.01); *H01R 13/428* (2013.01); *H05K 5/0047* (2013.01)

(58) Field of Classification Search
CPC .. H05K 5/0221; H05K 5/0047; H01R 13/428; H01R 13/6581; H01R 13/6215
See application file for complete search history.

(56) References Cited

U.S. PATENT DOCUMENTS

| | | | | |
|---|---|---|---|---|
| 6,315,585 B1* | 11/2001 | Oka | ................. | H01R 13/62938 439/157 |
| 6,375,487 B1* | 4/2002 | Tennessen | ......... | H01R 13/5845 439/373 |
| 6,910,911 B2* | 6/2005 | Mellott | .............. | H01R 13/2421 439/341 |
| 6,939,161 B1* | 9/2005 | Yi | ...................... | H01R 13/6395 439/373 |

(Continued)

FOREIGN PATENT DOCUMENTS

| | | | | |
|---|---|---|---|---|
| CH | 695523 A5 * | 6/2006 | ......... | H01R 13/5202 |
| DE | 202010002819 U1 * | 8/2010 | ............. | A01K 83/00 |

(Continued)

OTHER PUBLICATIONS

Translation of DE-102016108780-A1 (Year: 2017).*

(Continued)

Primary Examiner — Abhishek M Rathod
(74) Attorney, Agent, or Firm — McClure, Qualey & Rodack, LLP

(57) ABSTRACT

An electronic device and an unlocking cover thereof are provided. The unlocking cover includes a shield, at least one assembling portion, and at least one abutting portion. The shield has a baffle and a shielding board that is connected to the baffle. The at least one assembling portion extends from the baffle. The at least one abutting portion extends from an inner surface of the shield. A distal end of the at least one abutting portion away from the shielding board is spaced apart from an inner surface of the shielding board by a triggering height that is within a range from 3.5 mm to 9 mm.

19 Claims, 20 Drawing Sheets

(56) References Cited

U.S. PATENT DOCUMENTS

| | | | | |
|---|---|---|---|---|
| 7,495,900 | B2* | 2/2009 | Shi | G06F 1/181 |
| | | | | 361/679.02 |
| 8,033,844 | B2* | 10/2011 | Kobayashi | H01R 13/62955 |
| | | | | 439/157 |
| 8,292,652 | B2* | 10/2012 | Rohde | H01R 13/6272 |
| | | | | 439/352 |
| 8,545,243 | B2* | 10/2013 | Lin | H01R 13/6397 |
| | | | | 439/133 |
| 9,293,858 | B2* | 3/2016 | Iikhanov | H01R 13/5845 |
| 10,395,082 | B1* | 8/2019 | Thompson | G06K 7/10881 |
| 11,050,189 | B1* | 6/2021 | Garcia | H01R 13/6215 |
| 11,527,850 | B1* | 12/2022 | Wright | H01R 13/5825 |
| 11,527,851 | B2* | 12/2022 | Nguyen | H01R 13/639 |
| 11,552,428 | B2* | 1/2023 | Goodfellow | H01R 13/6273 |

FOREIGN PATENT DOCUMENTS

| | | | | | |
|---|---|---|---|---|---|
| DE | 102016108780 | A1 | * | 11/2017 | H01R 13/6273 |
| EP | 1371114 | B1 | * | 9/2004 | H01R 13/6397 |
| EP | 2444828 | B1 | * | 6/2016 | G02B 6/3893 |
| JP | 4087711 | B2 | | 5/2008 | |

OTHER PUBLICATIONS

Translation of EP-1371114-B1 (Year: 2004).*
Translation of DE-202010002819-U1 (Year: 2010).*
Translation of CH-695523-A5 (Year: 2006).*
Translation of EP-2444828-B1 (Year: 2016).*

* cited by examiner

ELECTRONIC DEVICE AND UNLOCKING COVER THEREOF

CROSS-REFERENCE TO RELATED PATENT APPLICATION

This application claims the benefit of priority to Taiwan Patent Application No. 110122508, filed on Jun. 21, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an electronic device, and more particularly to an electronic device and an unlocking cover thereof capable of unlocking a connector.

BACKGROUND OF THE DISCLOSURE

A conventional electronic device includes a chassis and a connector that is disposed in the chassis and that is provided for insertion of an external cable connector. However, due to a structure of the conventional electronic device, connection or separation between the connector and the external cable connector is inconvenient.

SUMMARY OF THE DISCLOSURE

In response to the above-referenced technical inadequacy, the present disclosure provides an electronic device and an unlocking cover thereof to effectively improve on the issues associated with conventional electronic devices.

In one aspect, the present disclosure provides an electronic device, which includes a main body and an unlocking cover. The main body includes a chassis and a connector. The chassis surroundingly defines an accommodating space, and the chassis has an opening in spatial communication with the accommodating space. The connector is arranged in the accommodating space. The connector corresponds in position to the opening for insertion of a cable connector. The unlocking cover has a shield, at least one assembling portion that extends from the shield, and at least one abutting portion that extends from an inner surface of the shield. The unlocking cover is configured to be detachably fastened to the chassis through the at least one assembling portion, so that the shield covers at least part of the opening, and at least part of the at least one abutting portion is arranged in the accommodating space of the chassis. When the cable connector is inserted and locked into the connector to be in a lock position, the at least one abutting portion of the unlocking cover is configured to abut against at least one unlock portion of the cable connector so as to adjust the cable connector to move from the lock position to an unlock position for separating from the connector.

In another aspect, the present disclosure provides an unlocking cover of an electronic device. The unlocking cover has a shield, at least one assembling portion, and at least one abutting portion. The shield has a baffle and a shielding board that is connected to the baffle. The at least one assembling portion extends from the baffle. The at least one abutting portion extends from an inner surface of the shield. Moreover, a distal end of the at least one abutting portion away from the shielding board is spaced apart from an inner surface of the shielding board by a triggering height that is within a range from 3.5 mm to 9 mm.

Therefore, in the electronic device provided by the present disclosure, the unlocking cover can be used as a protective cover by being fastened to the chassis, and the unlocking cover can be used as a tool for detaching the cable connector from the main body, thereby facilitating connection or separation between the main body and the cable connector.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
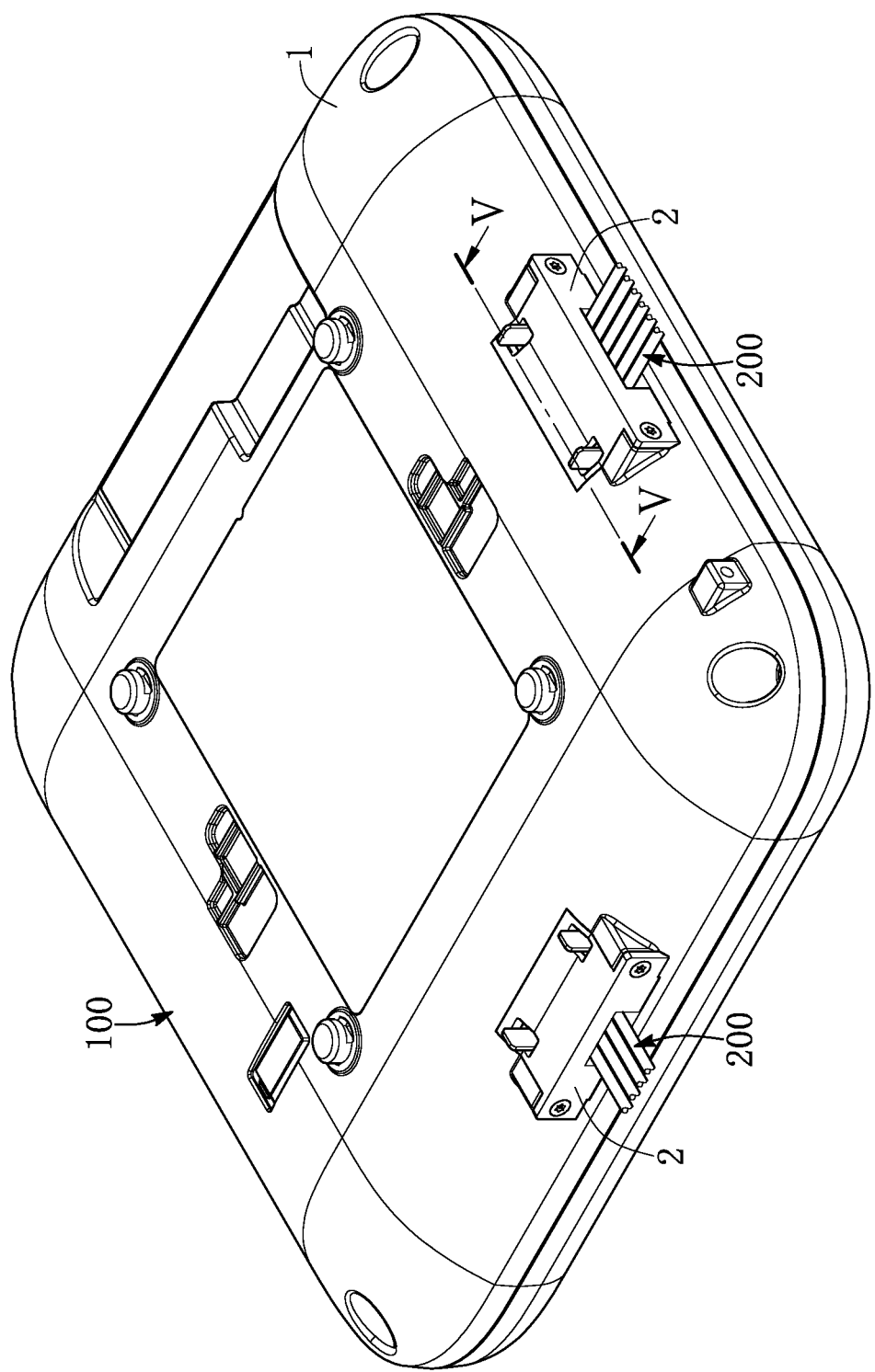
FIG. 1 is a perspective view of an electronic device according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 7, a first embodiment of the present disclosure provides an electronic device 100 that can be an antenna device, but the present disclosure is not limited thereto. As shown in FIG. 1, the electronic device 100 includes a main body 1 and two unlocking covers 2 that are detachably fastened to the main body 1. The following description discloses the structure of just one of the two unlocking covers 2 and a corresponding portion of the main body 1 for the sake of brevity, but the present disclosure is not limited thereto. In other words, a quantity of the unlocking covers 2 of the present disclosure can be at least one.

It should be noted that the unlocking cover 2 in the present embodiment is described in cooperation with the main body 1, but the present disclosure is not limited thereto. For example, in other embodiments of the present disclosure not shown in the drawings, the unlocking cover 2 can be independently used (e.g., sold) or can be used in cooperation with other components. The following description describes the structure and connection of the main body 1 and the unlocking cover 2.

Figure 2:
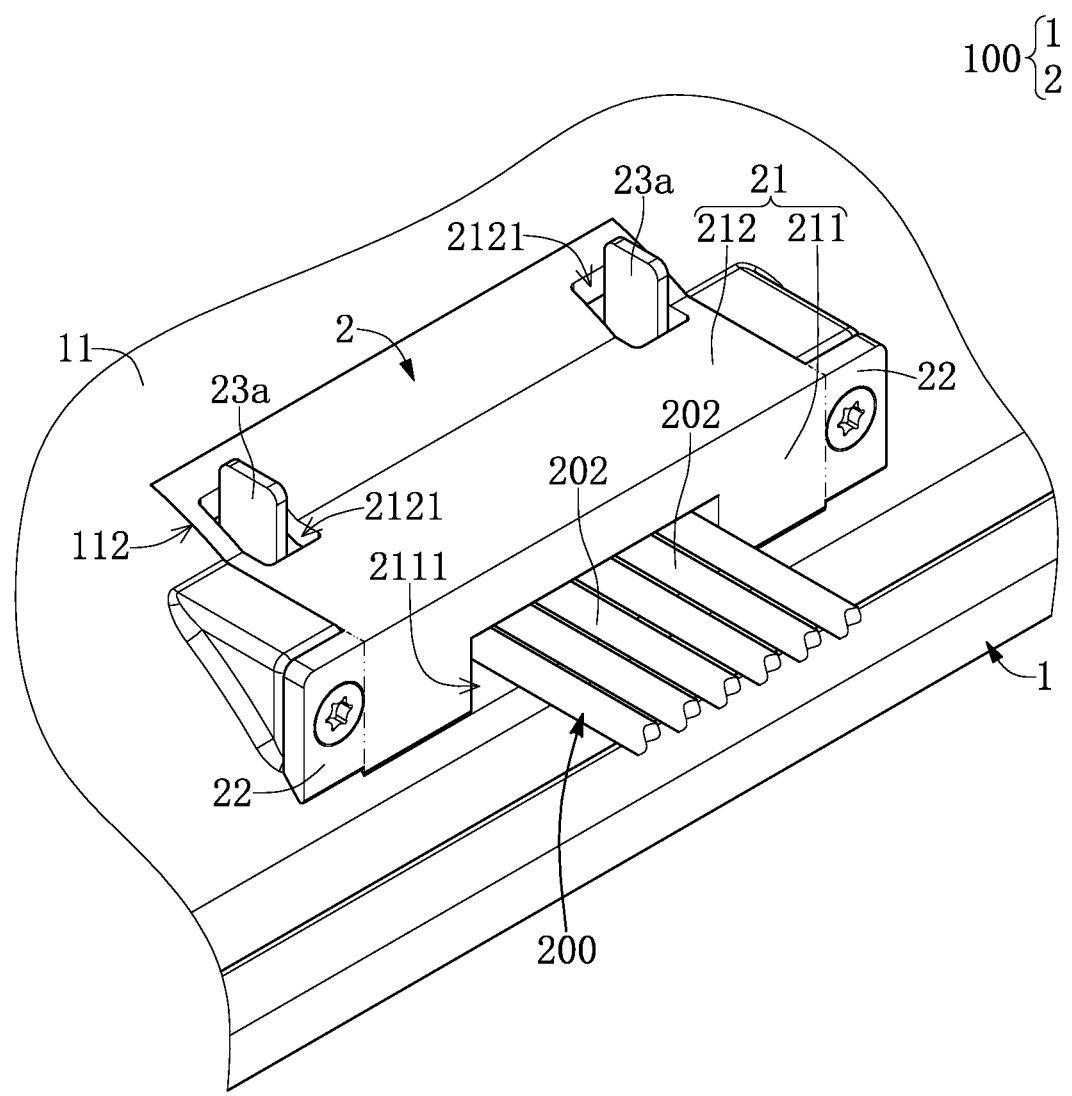
FIG. 2 is a partial enlarged view of FIG. 1.
Figure 3:
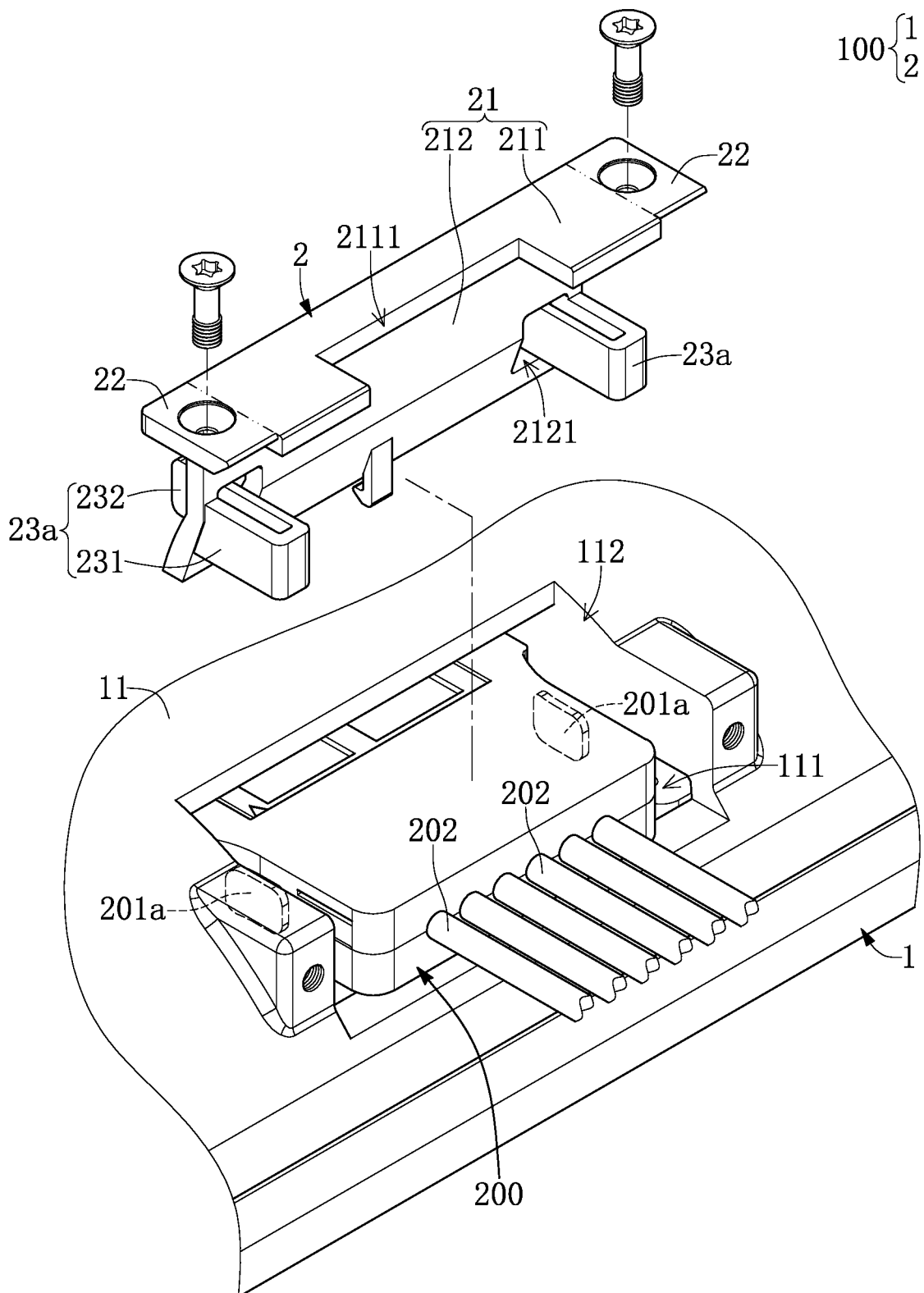
FIG. 3 is an exploded perspective view of FIG. 2.
Figure 4:
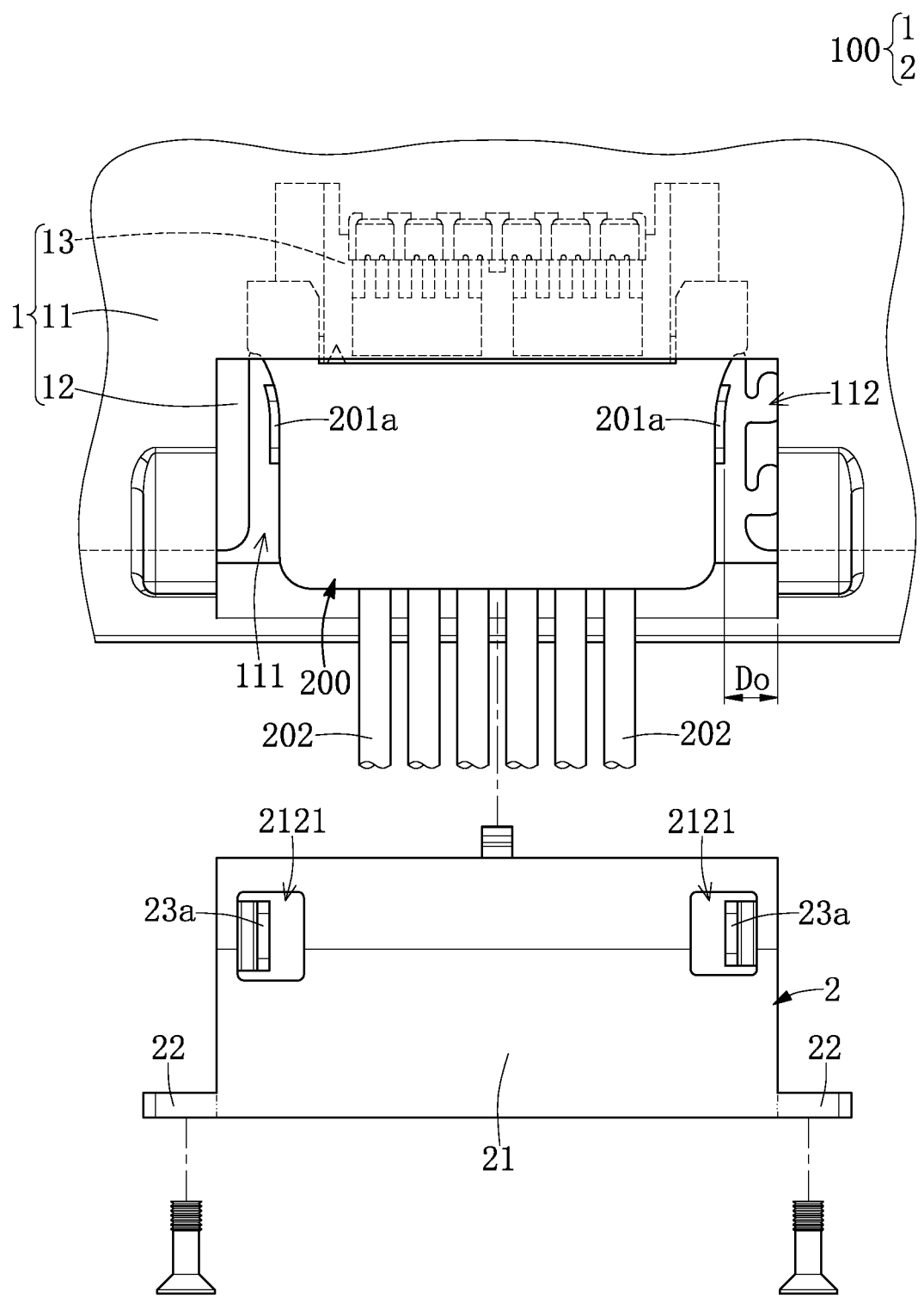
FIG. 4 is an exploded planar view of FIG. 2.

As shown in FIG. 2 to FIG. 4, the main body 1 includes a chassis 11, an electrical assembly 12 that is arranged in the chassis 11, and a connector 13 that is assembled to the electrical assembly 12. The chassis 11 surroundingly defines an accommodating space 111, and the chassis 11 has an opening 112 in spatial communication with the accommodating space 111. The electrical assembly is an electronic module used to implement an operation of the main body 1. For example, the electrical assembly 12 can include a circuit board and a plurality of electronic components that are assembled to the circuit board. The connector 13 is arranged in the accommodating space 111 (e.g., the connector 13 is assembled onto the circuit board), and the connector 13 corresponds in position to the opening 112 so a cable connector 200 can be inserted into the connector 13 through the opening 112.

It should be noted that the cable connector 200 in the present embodiment includes two unlock portions 201a that are respectively arranged on two opposite sides thereof (e.g., the left side and the right side of the cable connector 200 shown in FIG. 4), and the cable connector 200 further includes a plurality of transmission cables 202. In a lock position, the cable connector 200 is inserted into and locked to the connector 13 (shown in FIG. 4), where any one of the two unlock portions 201a and a portion of the main body 1 adjacent thereto have an operation distance Do there-between that is within a range from 1 mm to 4 mm. The operation distance Do in the present embodiment is defined in an arrangement direction of the two unlock portions 201a.

The unlocking cover 2 has a shield 21, two assembling portions 22 that respectively extend from two ends of the shield 21, and two abutting portions 23a that extend from an inner surface of the shield 21. The unlocking cover 2 is configured to be detachably fastened to (e.g., screwed to) the chassis 11 through the two assembling portions 22, so that the shield 21 covers at least part of the opening 112, at least part of any one of the two abutting portions 23a is arranged in the accommodating space 111 of the chassis 11, and an outer surface of the shield 21 and outer surfaces of the two assembling portions 22 are preferably flush with the chassis 11.

Figure 6:
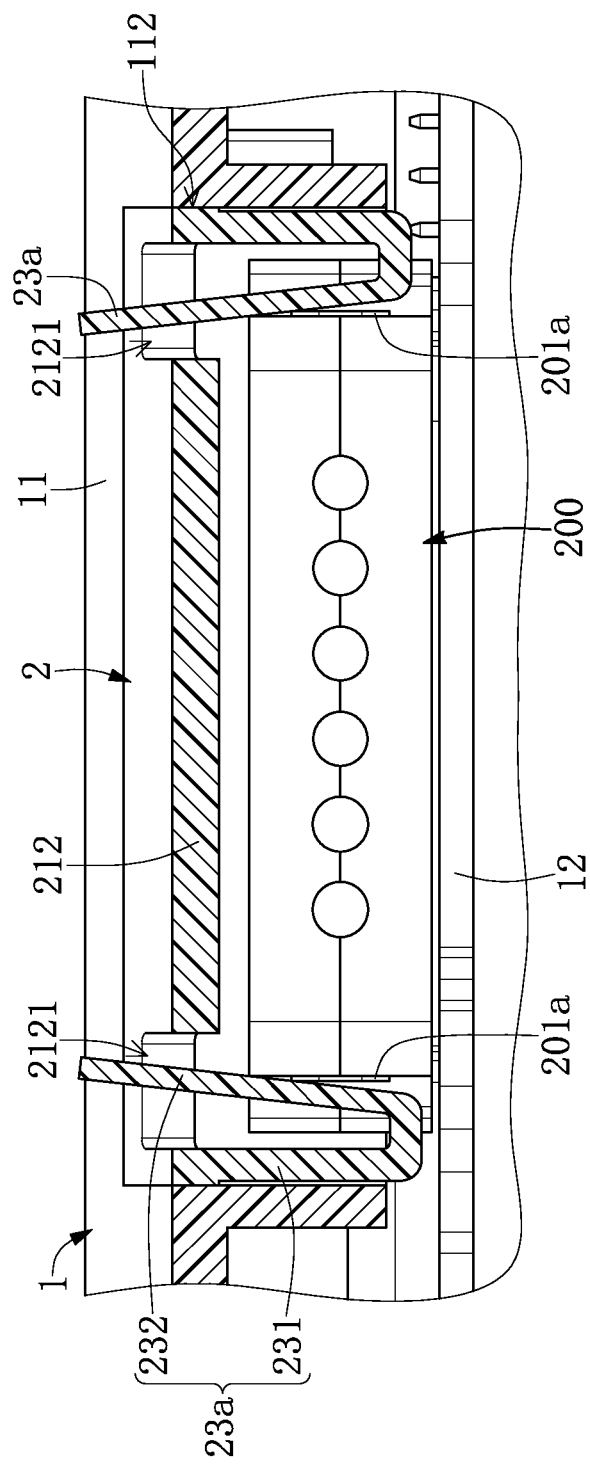
FIG. 6 is a cross-sectional view showing an unlocking cover of FIG. 5 being applied with a force.
Figure 7:
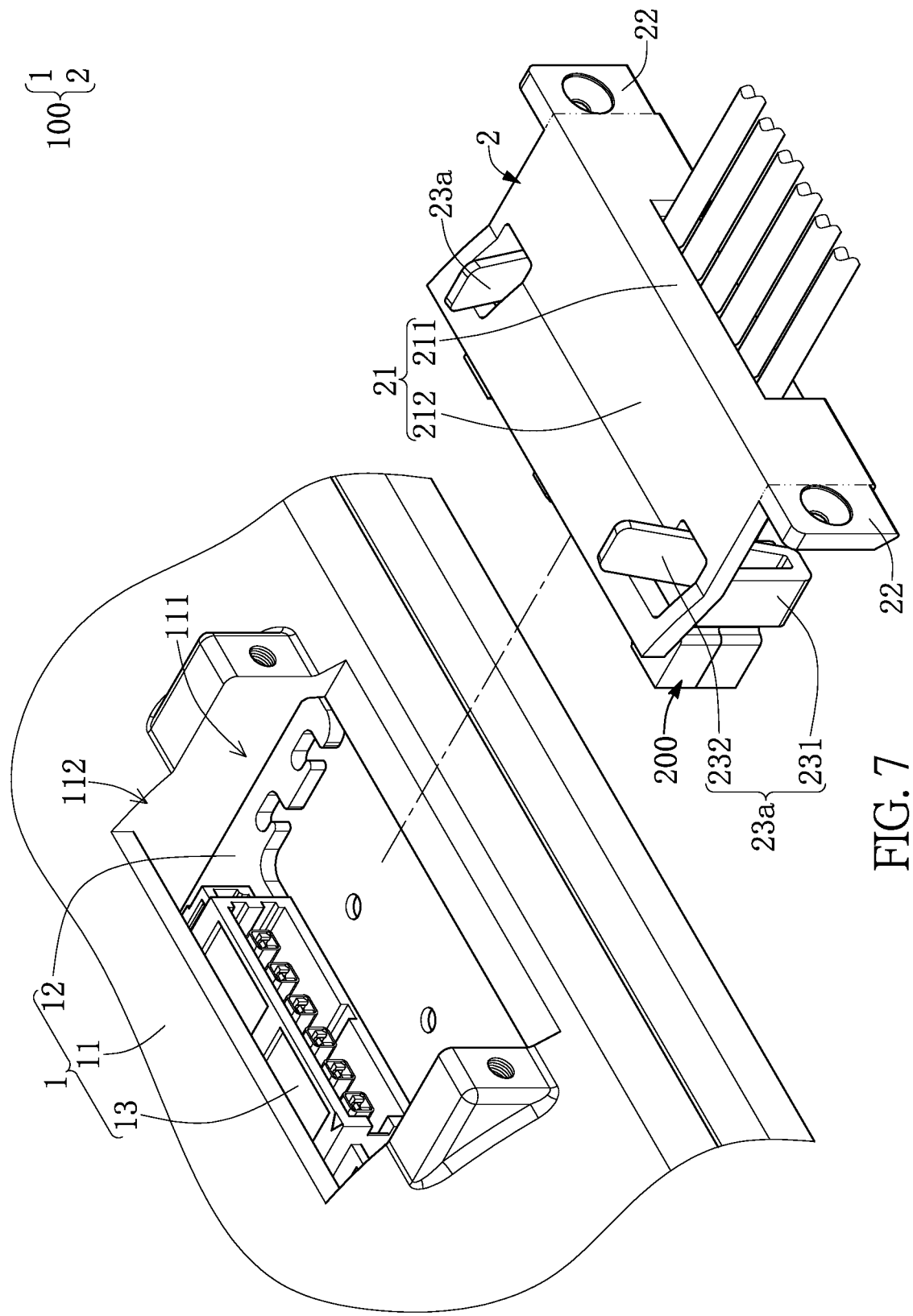
FIG. 7 is a fragmentary perspective view showing the unlocking cover of FIG. 2 clamping a cable connector to jointly detach from a main body.

Specifically, since the operation distance Do is less than a finger width of a user, neither one of the two unlock portions 201a of the cable connector 200 is suitable to be pressed by the user, and as such the cable connector 200 is difficult to be removed/separated from the connector 13. In the present embodiment, when the cable connector 200 is in the lock position (shown in FIG. 5), the unlocking cover 2 is configured to abut against the two unlock portions 201a of the cable connector 200 through the two abutting portions 23a, respectively, so as to adjust the cable connector 200 from the lock position to an unlock position for separating from the connector 13 (as shown in FIG. 6 and FIG. 7).

It should be noted that according to design requirements, the unlocking cover 2 may vary in structures in order to adjust the cable connector 200 from the lock position to the unlock position, and the unlocking cover 2 in the present embodiment is described by having the following structure, but the present disclosure is not limited thereto. For example, in other embodiments of the present disclosure not shown in the drawings, a quantity of the assembling portions 22 can be at least one, and the unlocking cover 2 can be detachably fastened to the chassis 11 through the at least one assembling portion 22.

Figure 5:
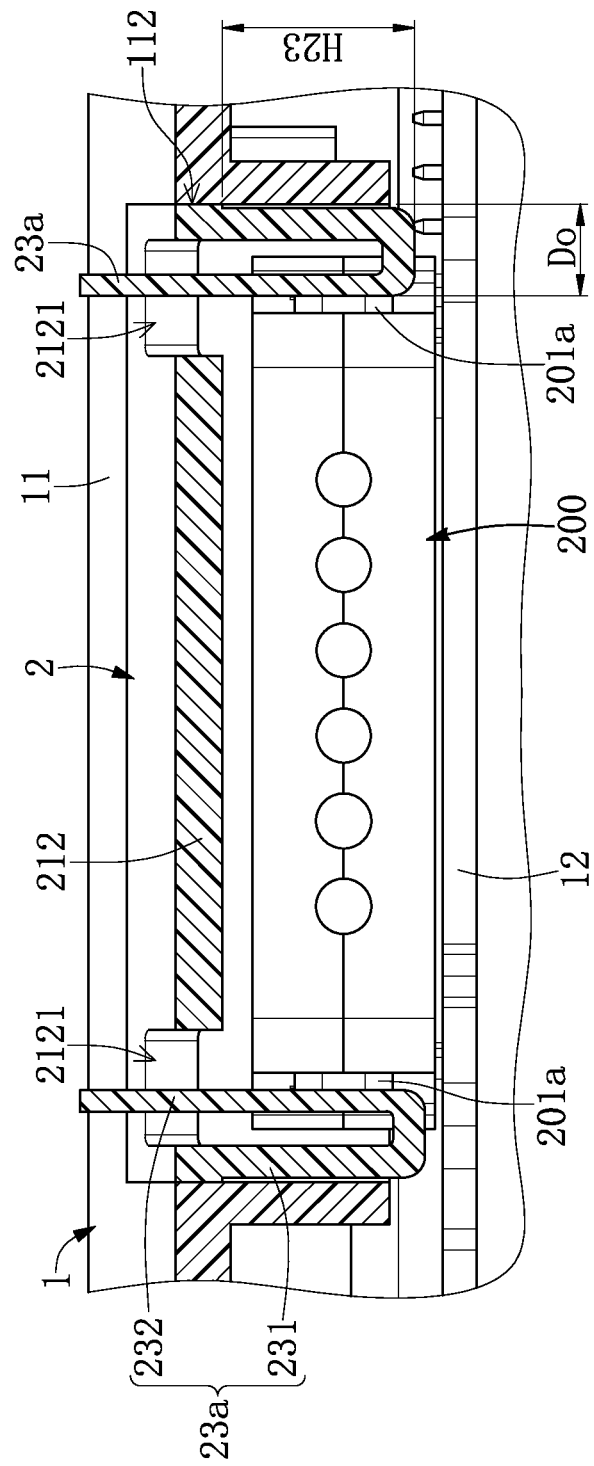
FIG. 5 is a cross-sectional view taken along line V-V of FIG. 1.

In the present embodiment, as shown in FIG. 3 to FIG. 5, the shield 21 has a baffle 211 and a shielding board 212 that is substantially perpendicularly connected to the baffle 211. The two assembling portions 22 respectively extend from two ends of the baffle 211 (e.g., the baffle 211 and the two assembling portions 22 are jointly formed as a flat board), and the baffle 211 has a cable hole 2111 arranged between the two assembling portions 22. When the unlocking cover 2 is fastened to the chassis 11, the accommodating space 111 can be in spatial communication with an external space through the cable hole 2111. Moreover, when the cable connector 200 is inserted into the connector 13 and the unlocking cover 2 is fastened to the chassis 11, at least one of the transmission cables 202 of the cable connector 200 passes through the cable hole 2111.

Furthermore, the shielding board 212 has two notches 2121 respectively corresponding in position to the two abutting portions 23a. The two abutting portions 23a face each other and are spaced apart from each other, and the two abutting portions 23a in the present embodiment are substantially in a mirror symmetrical arrangement, but the present disclosure is not limited thereto. It should be noted that a quantity of the notches 2121 of the shielding board 212 in the present embodiment is two, but the present disclosure is not limited thereto. For example, in other embodiments of the present disclosure not shown in the drawings, a portion of the shielding board 212 of FIG. 4 between the two notches 2121 can be further removed, such that the two notches 2121 are in spatial communication with each other so as to be jointly formed as at least one notch 2121.

In the present embodiment, each of the two abutting portions 23a has a pressing segment 231 that extends from the inner surface of the shielding board 212 toward the corresponding notch 2121 and a manipulation segment 232 that extends from the pressing segment 231 and passing through the corresponding notch 2121. In any one of the two abutting portions 23a, the pressing segment 231 is substantially in a U-shape having two ends, one of the two ends is connected to a portion of the shielding board 212 between the corresponding notch 2121 and an adjacent lateral edge of the shielding board 212, and another one of the two ends corresponds in position to the corresponding notch 2121.

Accordingly, as shown in FIG. 5 and FIG. 6, when the cable connector 200 is in the lock position and the unlocking cover 2 is disposed on the chassis 11, the manipulation segments 232 of the two abutting portions 23a can be pressed to move along a direction toward each other, so that the pressing segments 231 of the two abutting portions 23a are elastically deformed to clamp the two unlock portions 201a, and the cable connector 200 is adjusted from the lock position to the unlock position.

In order to effectively unlock the cable connector 200 by the two abutting portions 23a of the unlocking cover 2, the unlocking cover 2 is preferably provided with the following features: a distal end of any one of the two abutting portions 23a away from the shielding board 212 (e.g., a bottom end of the pressing segment 231 shown in FIG. 5) is spaced apart from the inner surface of the shielding board 212 by a triggering height H23 that is within a range from 4 mm to 9 mm, but the present disclosure is not limited thereto.

Therefore, in the electronic device 100 provided by the present embodiment of the present disclosure, the unlocking cover 2 can be used as a protective cover by being fastened to the chassis 11, and the unlocking cover 2 can be used as a tool for detaching the cable connector 200 from the main body 1 (i.e., the unlocking cover 2 can be used to adjust the cable connector 200 from the lock position to the unlock position), thereby facilitating connection or separation between the main body 1 (e.g., the connector 13) and the cable connector 200.

Second Embodiment

Referring to FIG. 8 to FIG. 11, a second embodiment of the present disclosure is provided, which is similar to the first embodiment of the present disclosure. For the sake of brevity, descriptions of the same components in the first and second embodiments of the present disclosure (e.g., the cable connector 200, the main body 1, the baffle 211 of the shield 21, the two assembling portions 22, the operation distance Do, and the triggering height H23) will be omitted herein, and the following description only discloses different features between the first and second embodiments.

Figure 8:
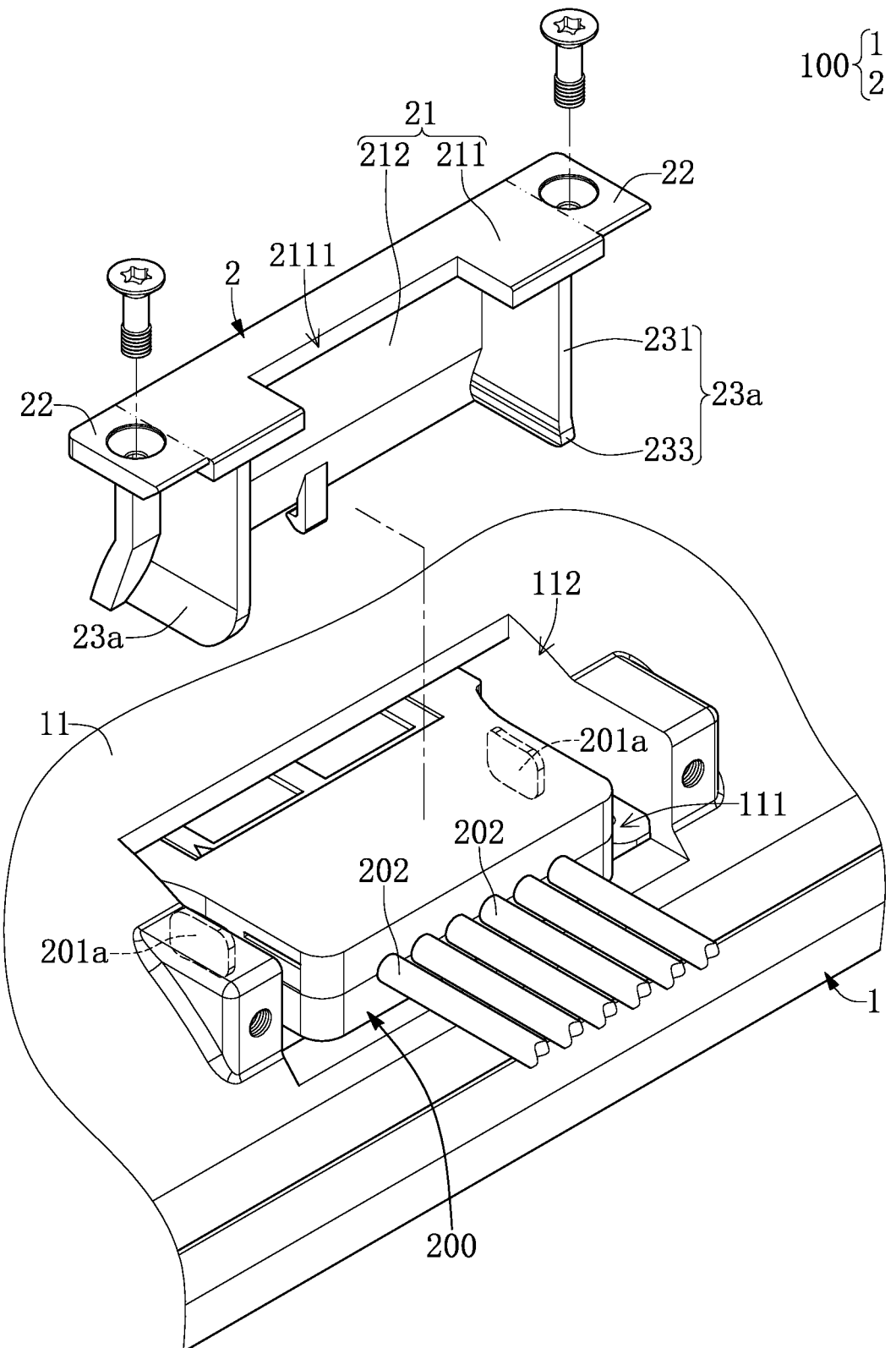
FIG. 8 is a partly exploded fragmentary view of the electronic device according to a second embodiment of the present disclosure.
Figure 9:
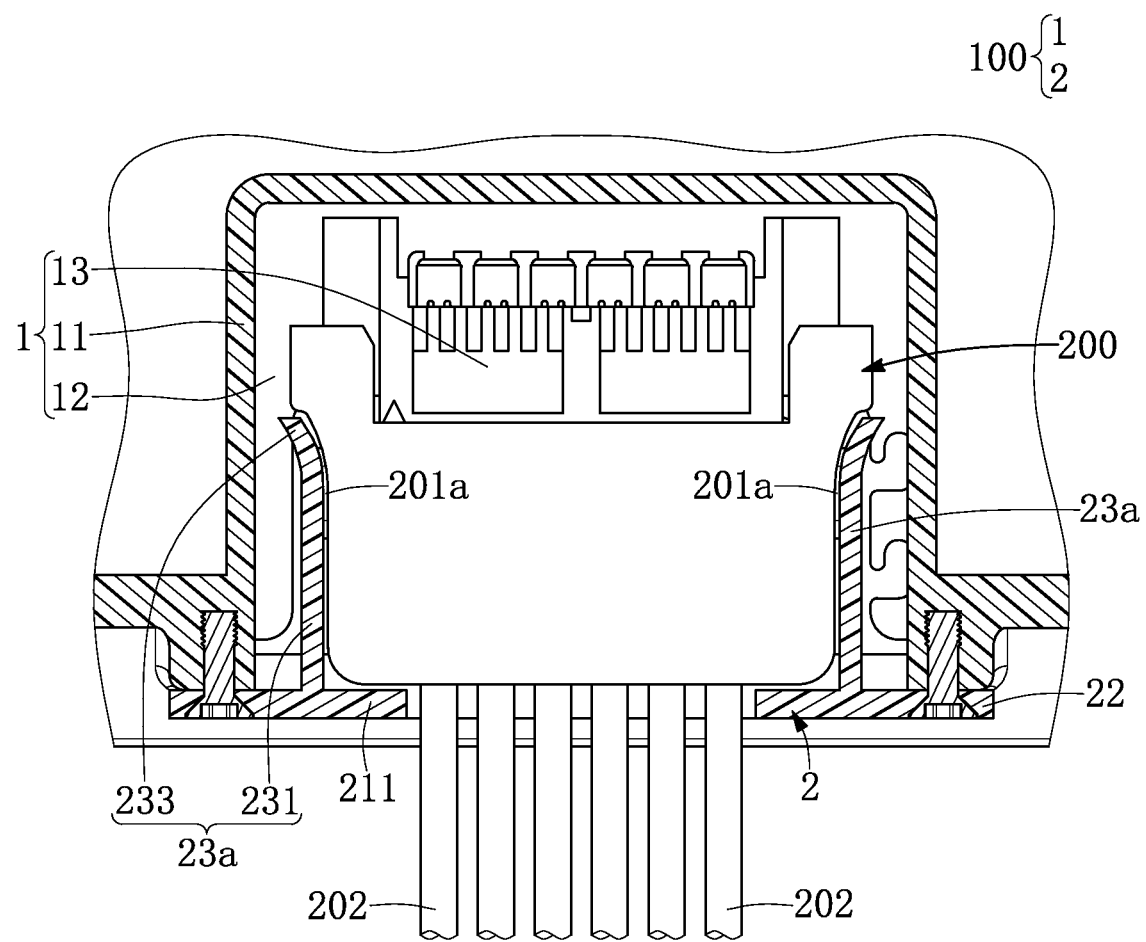
FIG. 9 is a cross-sectional view showing the electronic device of FIG. 8 according to the second embodiment of the present disclosure.

In the present embodiment, as shown in FIG. 8 and FIG. 9, the shielding board 212 of the shield 21 is formed without any notch 2121, and the two abutting portions 23a extend from the inner surface of the shield 21. Moreover, the two abutting portions 23a face each other and are spaced apart from each other, and the two abutting portions 23a are substantially in a mirror symmetrical arrangement, but the present disclosure is not limited thereto.

Specifically, each of the two abutting portions 23a has a pressing segment 231 that is connected to the baffle 211 and a guiding segment 233 that extends from the pressing segment 231 along a direction away from the baffle 211. In the present embodiment, the pressing segments 231 of the two abutting portions 23a are parallel to each other, one end of the pressing segments 231 is perpendicularly connected to the two ends of the baffle 211, respectively, and another end of the pressing segments 231 further extends along a direction away from each other so as to form the two guiding segments 233, respectively.

Accordingly, when the cable connector 200 is inserted the connector 13 and the unlocking cover 2 is fastened to the chassis 11, the two abutting portions 23a are arranged in the accommodating space 111 and clamp the two unlock portions 201a through the two pressing segments 231 so as to have the cable connector 200 maintained at the unlock position.

In other words, after the cable connector 200 is in the lock position, the unlocking cover 2 is fastened to the chassis 11 so as to synchronously adjust the cable connector 200 to the unlock position. When the unlocking cover 2 is fastened to the chassis 11, the cable connector 200 in the unlock position is still in a normal operation with the connector 13. However, when the cable connector 200 needs to be separated (or removed) from the connector 13, the unlocking cover 2 can be detached from the chassis 11 while synchronously clamping the cable connector 200 so as to detach it from the main body 1.

It should be noted that the unlocking cover 2 in the present embodiment clamps the two unlock portions 201a through the two pressing segments 231, respectively, but any one of the two pressing segments 231 and the corresponding guiding segment 233 can be configured to jointly abut against the corresponding unlock portion 201a.

Figure 10:
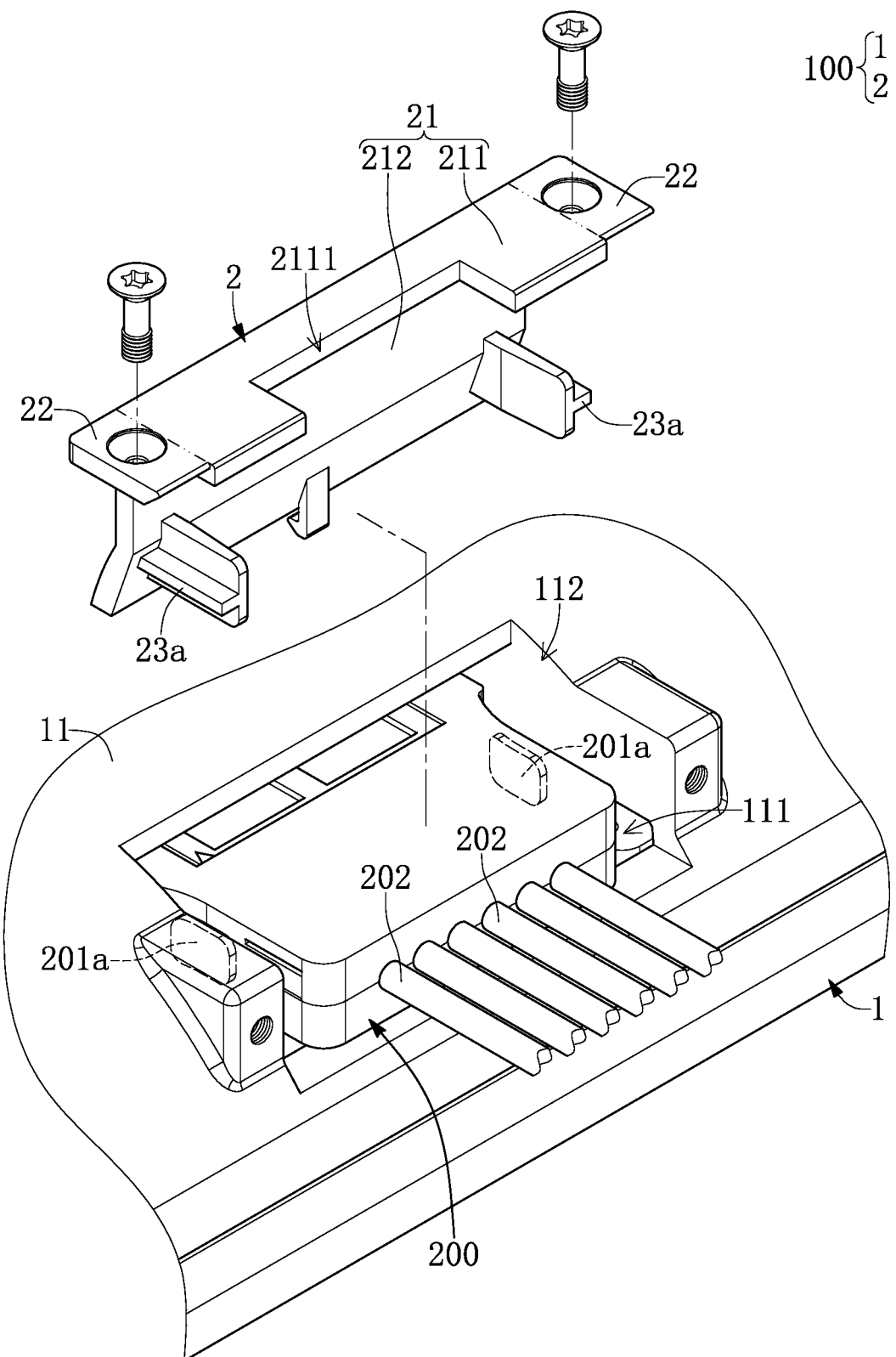
FIG. 10 is a partly exploded fragmentary view of the electronic device in another configuration according to the second embodiment of the present disclosure.
Figure 11:
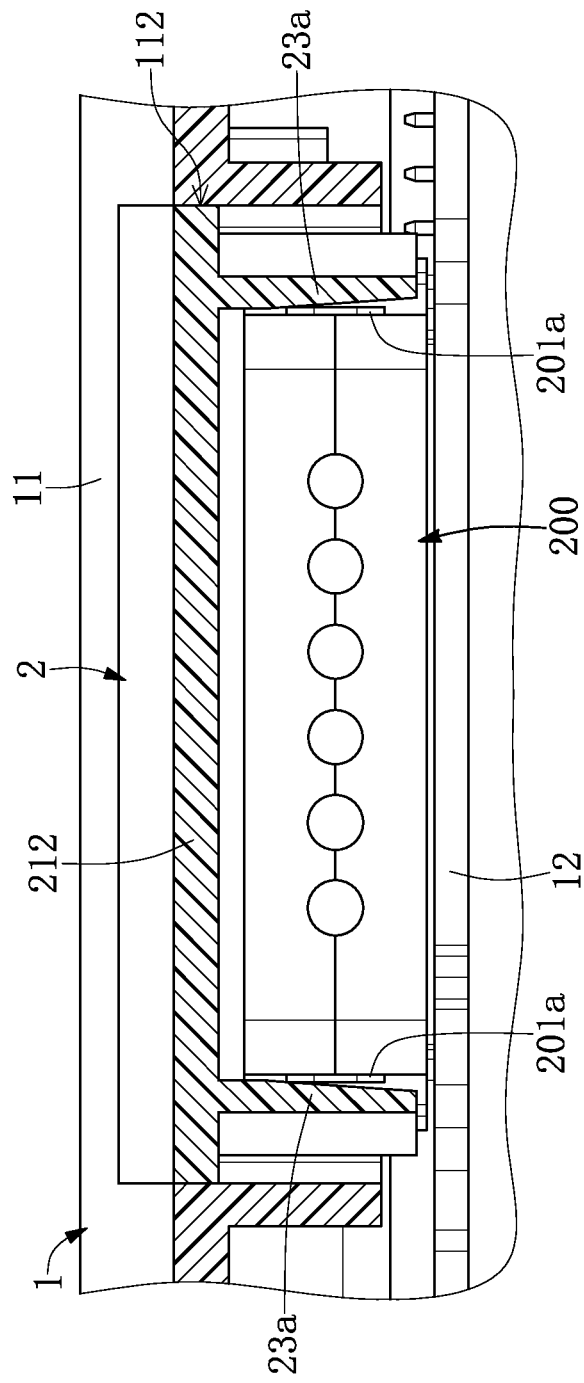
FIG. 11 is a cross-sectional view showing the electronic device of FIG. 10 according to the second embodiment of the present disclosure.

In addition, a structure of any one of the two abutting portions 23a of the unlocking cover 2 is provided as shown in FIG. 8 and FIG. 9, but the structure of any one of the two abutting portions 23a can be adjusted or changed according to design requirements. For example, as shown in FIG. 10 and FIG. 11, each of the two abutting portions 23a can be connected to the inner surface of the shielding board 212 in an upright manner, and any one of the two abutting portions 23a has a substantially T-shaped cross section that is perpendicular to a longitudinal direction thereof.

Third Embodiment

Figure 12:
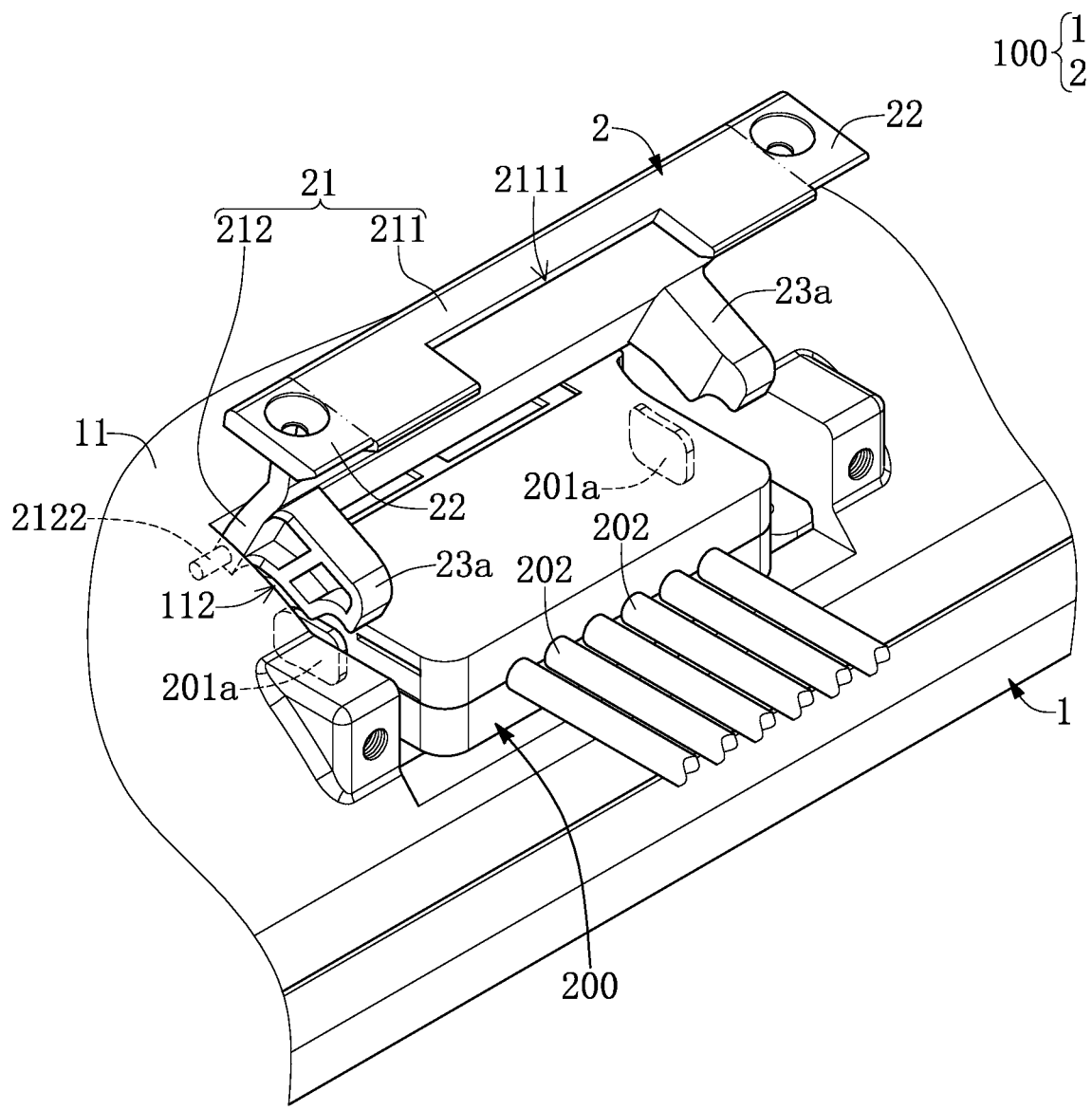
FIG. 12 is a fragmentary perspective view of the electronic device according to a third embodiment of the present disclosure.
Figure 13:
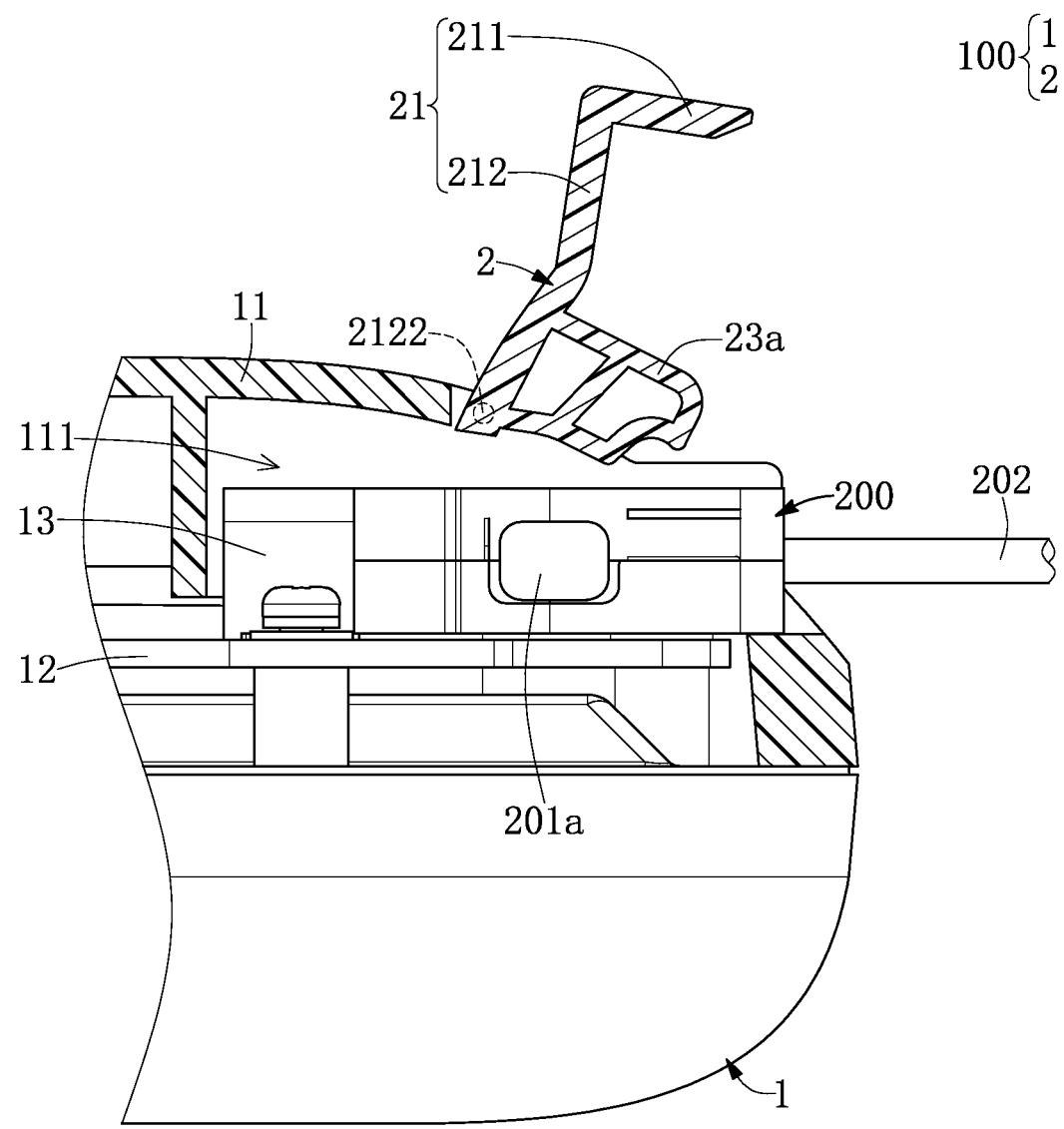
FIG. 13 is a cross-sectional view of FIG. 12.
Figure 14:
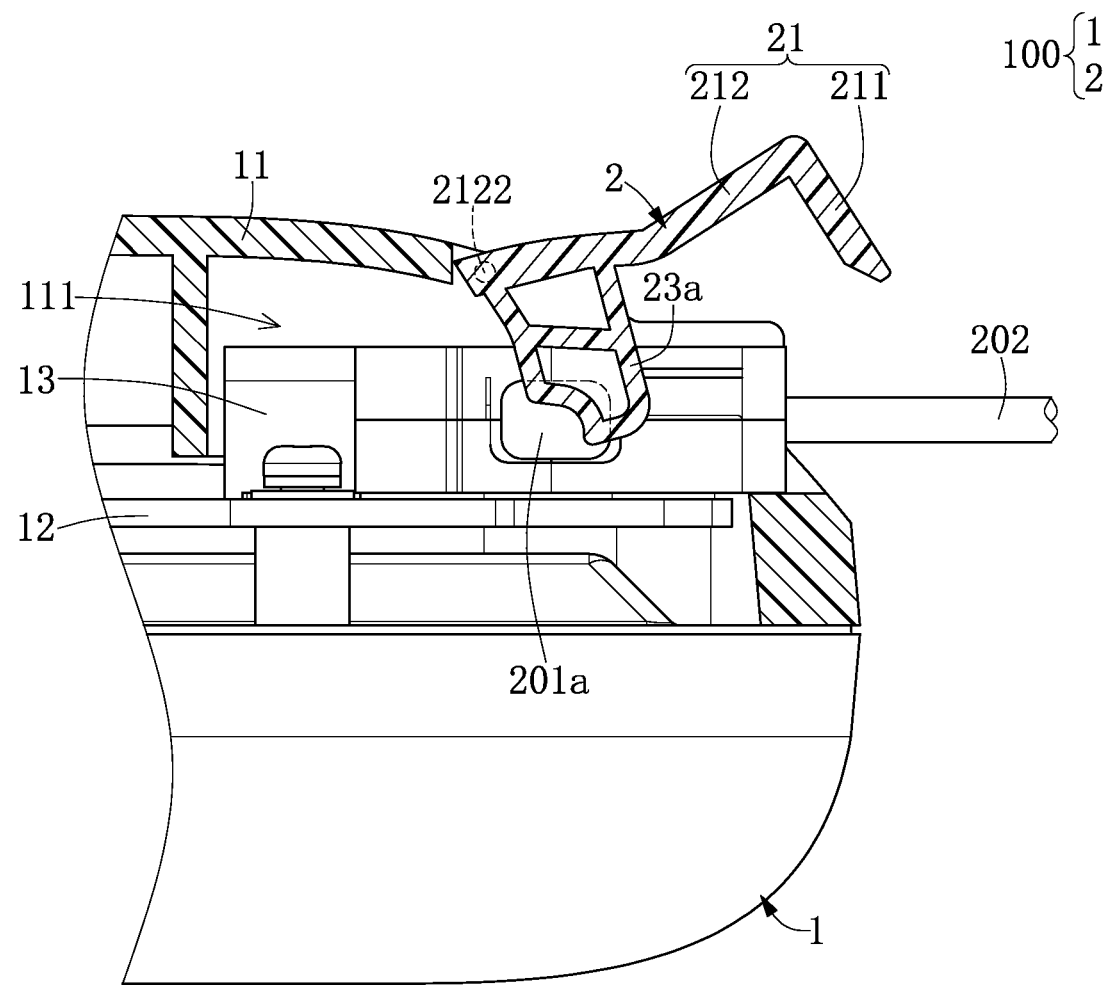
FIG. 14 is a cross-sectional view showing the unlocking cover of FIG. 13 after being rotated.

Referring to FIG. 12 to FIG. 14, a third embodiment of the present disclosure is provided, which is similar to the first embodiment of the present disclosure. For the sake of brevity, descriptions of the same components in the first and third embodiments of the present disclosure (e.g., the cable connector 200, the main body 1, the baffle 211 of the shield 21, the two assembling portions 22, the operation distance Do, and the triggering height H23) will be omitted herein, and the following description only discloses different features between the first and third embodiments.

In the present embodiment, the shielding board 212 of the shield 21 is formed without any notch 2121, and the shielding board 212 has a pivoting portion 2122 that is arranged away from the baffle 211 and that is pivotally connected to the chassis 11. The pivoting portion 2122 includes two shafts respectively arranged on two corners of the shielding board 212, and the chassis 11 has two shaft holes respectively corresponding in position to the two shafts, but the present disclosure is not limited thereto. For example, in other embodiments of the present disclosure not shown in the drawings, the pivoting portion 2122 includes two shaft holes respectively arranged on two corners of the shielding board 212, and the chassis 11 has two shafts respectively corresponding in position to the two shaft holes.

Moreover, each of the two abutting portions 23a is connected to the inner surface of the shielding board 212 in an upright manner. Through the shape design of each of the two abutting portions 23a, when the cable connector 200 is in the lock position, the shielding board 212 is configured to rotate relative to the chassis 11 by an angle within a predetermined angle range, so that the two abutting portions 23a clamp the two unlock portions 201a to adjust the cable connector 200 from the lock position to unlock position.

Fourth Embodiment

Figure 15:
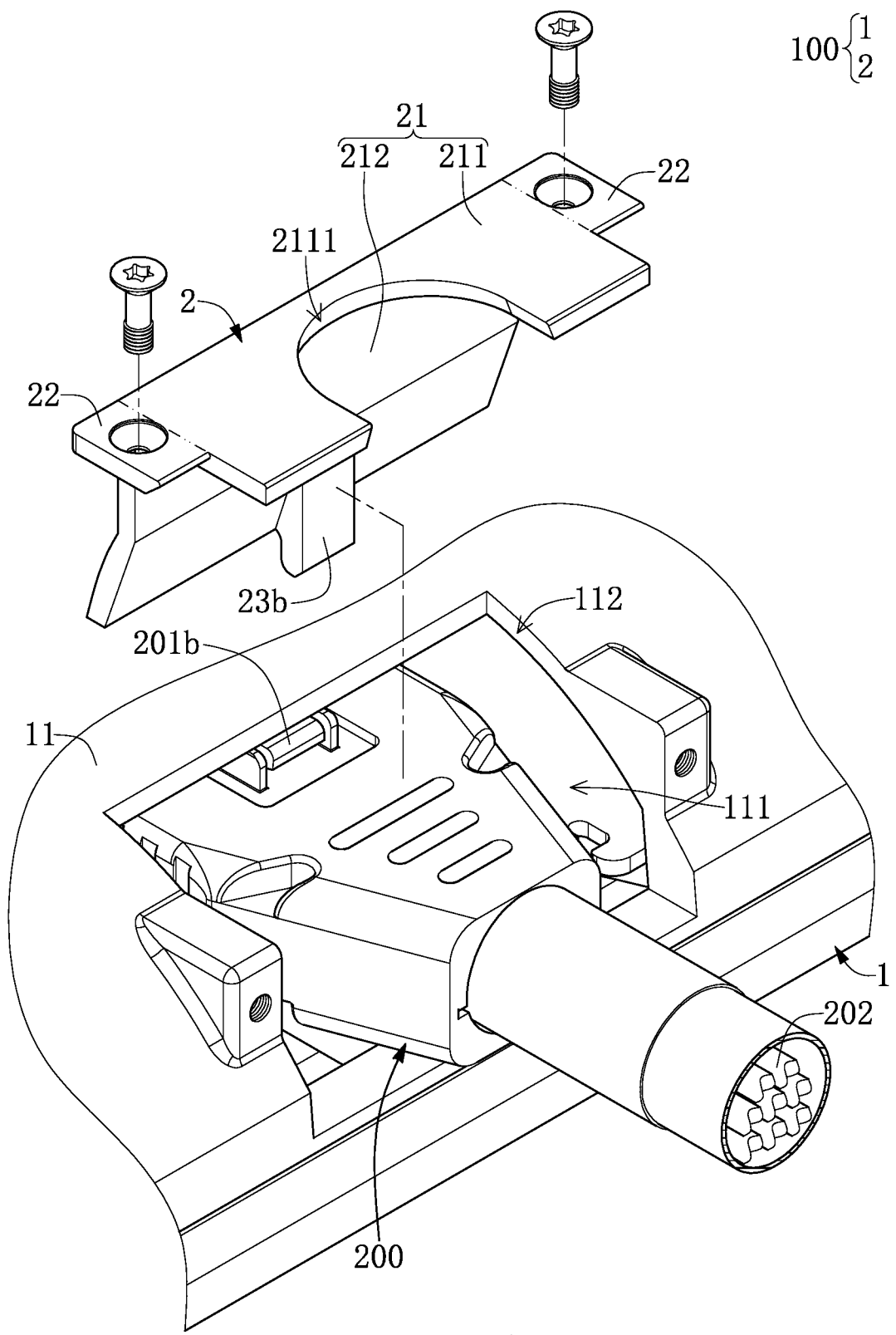
FIG. 15 is a partly exploded fragmentary view of the electronic device according to a fourth embodiment of the present disclosure.
Figure 16:
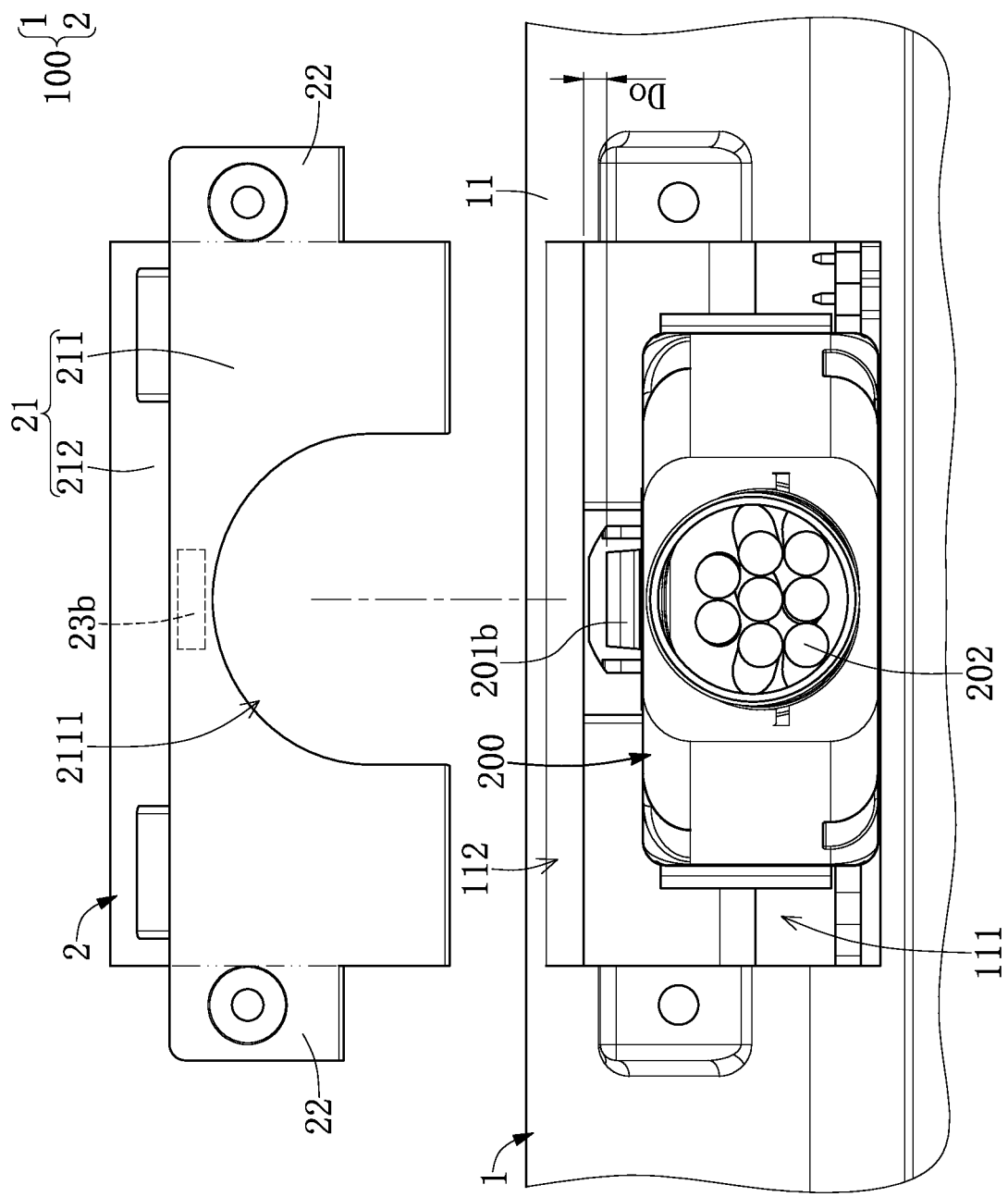
FIG. 16 is a planar view of FIG. 15.
Figure 17:
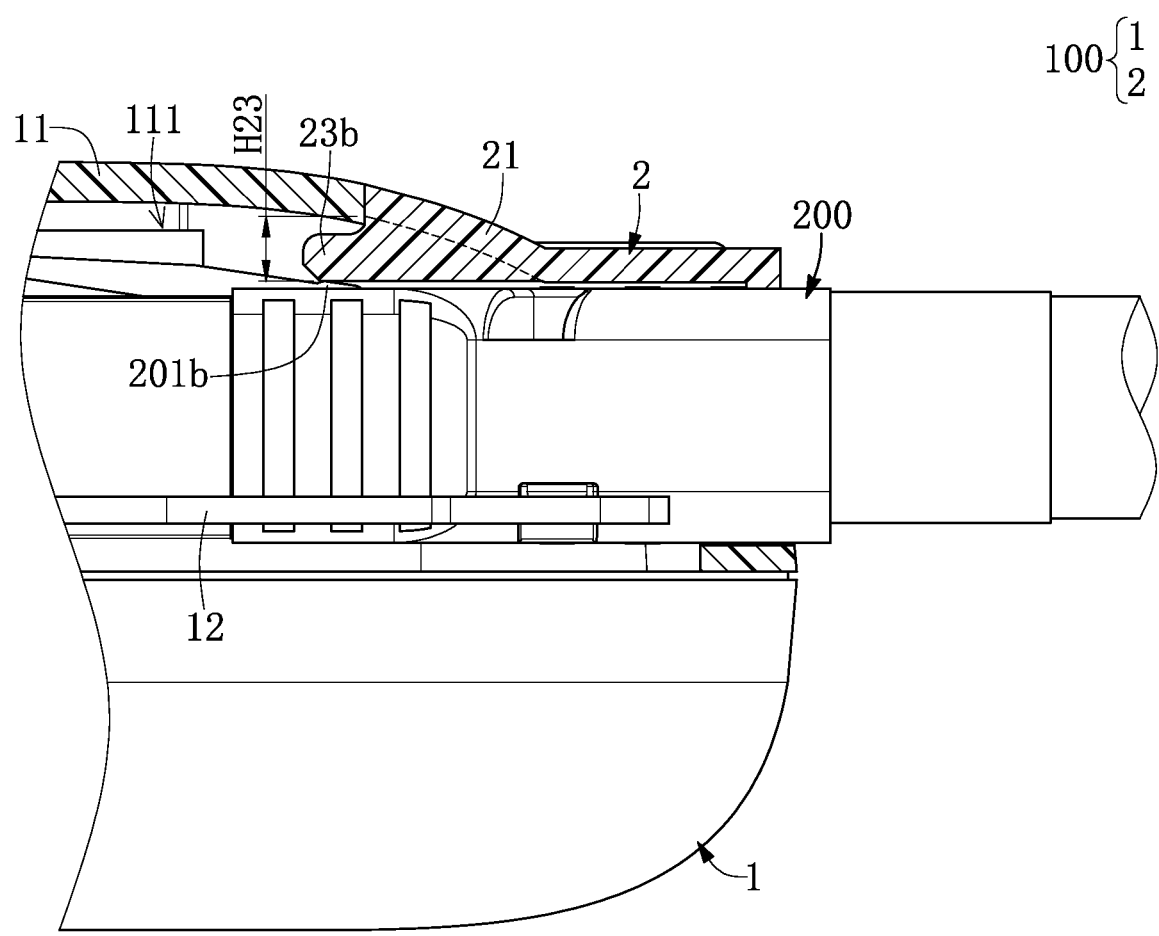
FIG. 17 is a cross-sectional view of the electronic device according to the fourth embodiment of the present disclosure.

Referring to FIG. 15 to FIG. 17, a fourth embodiment of the present disclosure is provided, which is similar to the first embodiment of the present disclosure. For the sake of brevity, descriptions of the same components in the first and fourth embodiments of the present disclosure (e.g., the main body 1, the baffle 211 of the shield 21, and the two assembling portions 22) will be omitted herein, and the following description only discloses different features between the first and fourth embodiments.

In the present embodiment, a quantity of the unlock portion 201b of the cable connector 200 is one, and the unlock portion 201b is arranged on one side of the cable connector 200 adjacent to the opening 112 (e.g., a top side of the cable connector 200 shown in FIG. 15). The cable connector 200 can be inserted into and locked to the connector 13 in a lock position (shown in FIG. 15 and FIG. 16), so that the unlock portion 201b and a portion of the main body 1 adjacent thereto have an operation distance Do there-between that is within a range from 1 mm to 3 mm. It should be noted that the operation distance Do can be adjusted or changed according to design requirements and is not limited to the features described in the first and fourth embodiments. For example, the operation distance Do in the present disclosure can be within a range from 1 mm to 8 mm.

Moreover, the shielding board 212 of the shield 21 is formed without any notch 2121, and a quantity of the abutting portion 23b of the unlocking cover 2 in the present embodiment is one. The abutting portion 23b is connected to a portion of the inner surface of the shielding board 212 arranged away from the baffle 211, and the abutting portion 23b protrudes from an edge of the shielding board 212 arranged away from the baffle 211. The triggering height H23 corresponding to the abutting portion 23b is within a range from 3.5 mm to 5 mm. In other words, according to the features described in the first embodiment and the present embodiment, the triggering height H23 of the present disclosure can be within a range from 3.5 mm to 9 mm.

Accordingly, when the cable connector 200 is at the lock position, the abutting portion 23b of the unlocking cover 200 can abut against the unlock portion 201b of the cable connector 200 so as to adjust the cable connector 200 from the lock position to an unlock position for separating from the connector 13. Specifically, when the cable connector 200 is inserted into the connector 13 and the unlocking cover 2 is fastened to the chassis 11, the abutting portion 23b is arranged in the accommodating space 111 and abuts against the unlock portion 201b so as to have the cable connector 200 maintained at the unlock position.

In other words, after the cable connector 200 is at the lock position, the unlocking cover 2 is fastened to the chassis 11 so as to synchronously adjust the cable connector 200 to the unlock position. When the unlocking cover 2 is fastened to the chassis 11, the cable connector 200 at the unlock position can be in a normal operation with the connector 13. However, when the cable connector 200 needs to be separated from the connector 13, the unlocking cover 2 can be detached from the chassis 11 so as to synchronously clamp the cable connector 200 to detach it from the main body 1.

In other embodiments of the present disclosure not shown in the drawings, the unlocking cover 2 can have the abutting portion 23b of the present embodiment and the two abutting portions 23a described in any one of the first to third embodiments, thereby being applied to more than one kind of the cable connectors 200.

Fifth Embodiment

Figure 18:
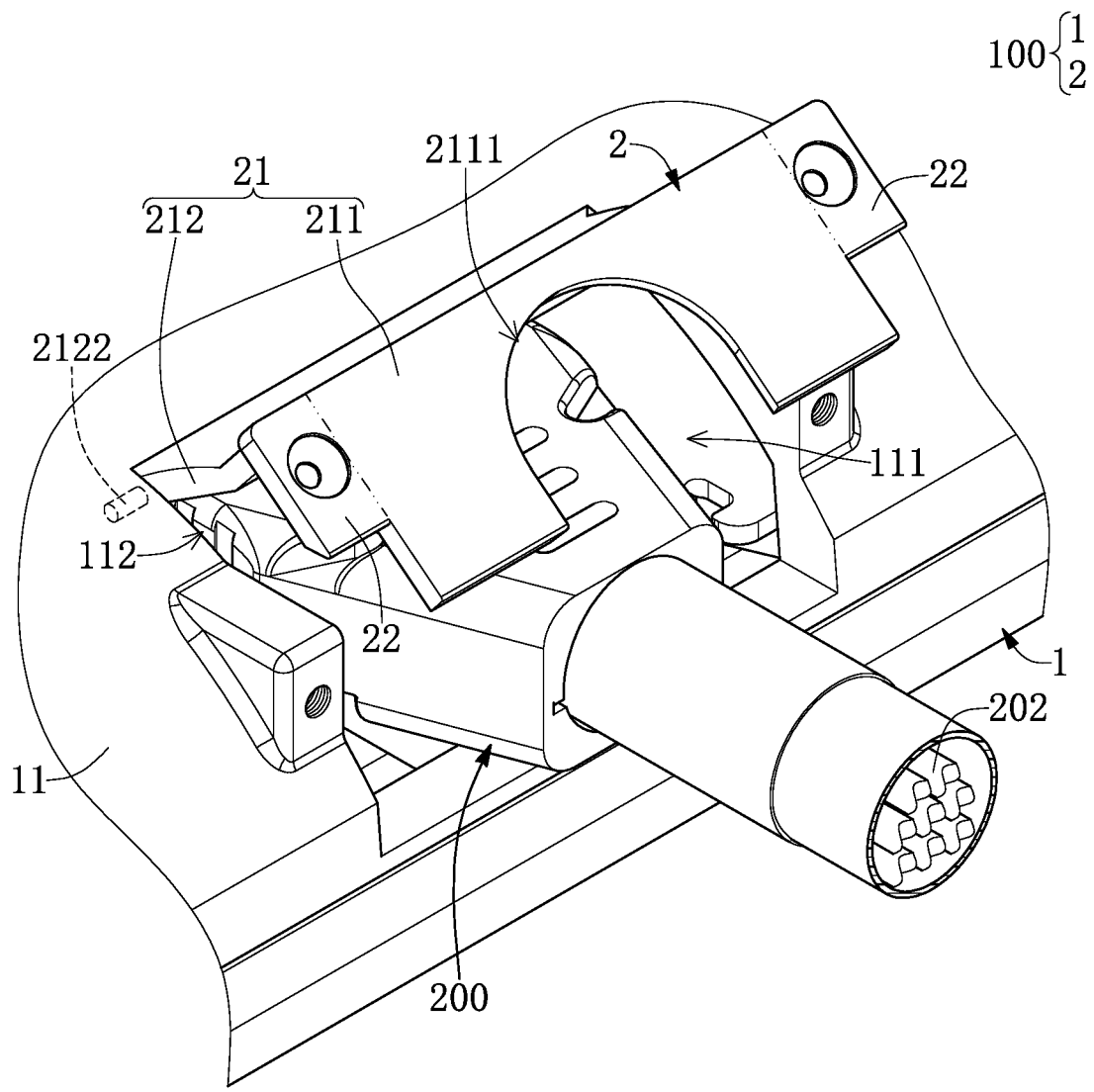
FIG. 18 is a fragmentary perspective view of the electronic device according to a fifth embodiment of the present disclosure.
Figure 19:
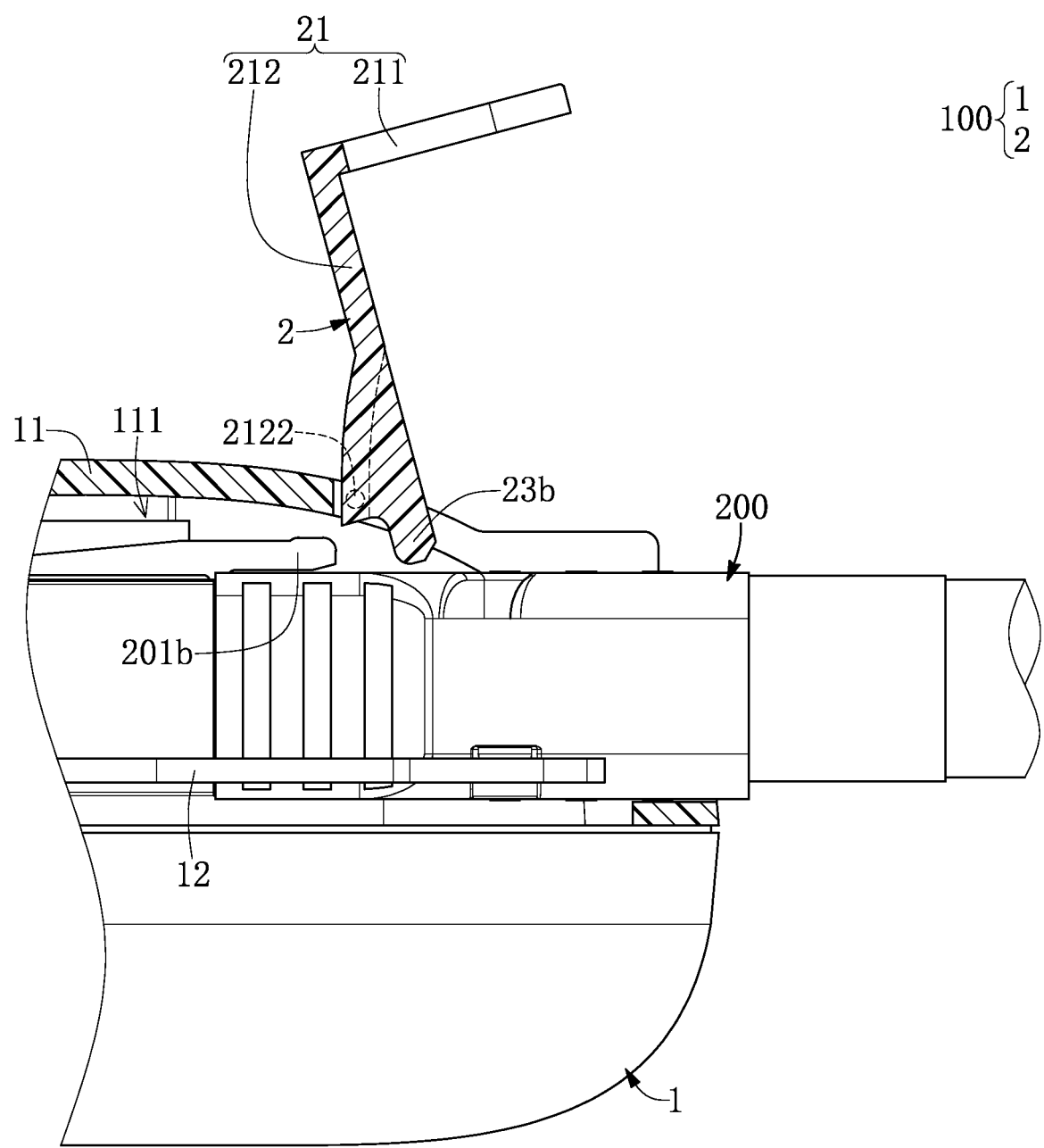
FIG. 19 is a cross-sectional view of FIG. 18.
Figure 20:
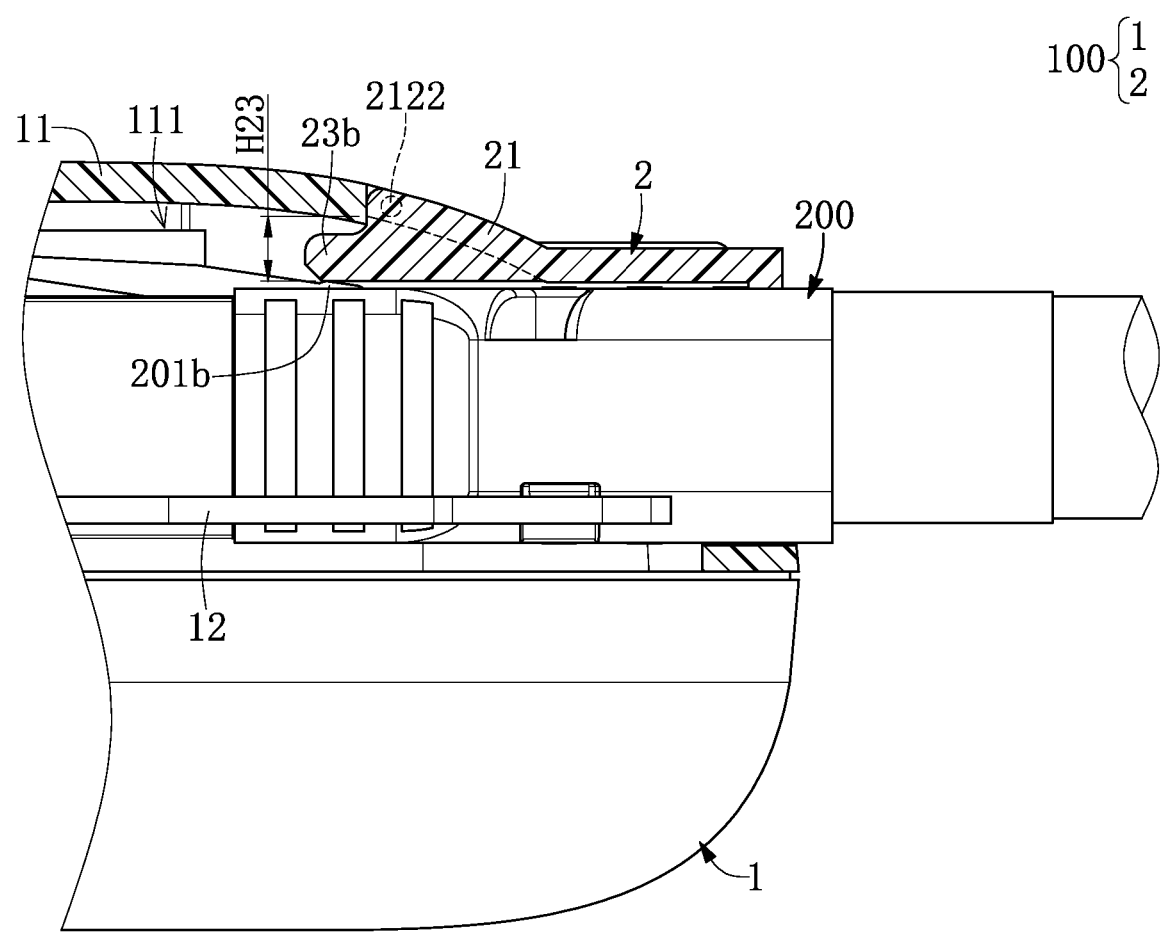
FIG. 20 is a cross-sectional view showing the unlocking cover of FIG. 19 after being rotated.

Referring to FIG. 18 to FIG. 20, a fifth embodiment of the present disclosure is provided, which is similar to the fourth embodiment of the present disclosure. For the sake of brevity, descriptions of the same components in the fourth and fifth embodiments of the present disclosure (e.g., the cable connector 200, the main body 1, the baffle 211 of the shield 21, the two assembling portions 22, the operation distance Do, and the triggering height H23) will be omitted herein, and the following description only discloses different features between the fourth and fifth embodiments.

In the present embodiment, the shielding board 212 has a pivoting portion 2122 that is arranged away from the baffle 211 and that is pivotally connected to the chassis 11. The pivoting portion 2122 includes two shafts respectively arranged on two corners of the shielding board 212, and the chassis 11 has two shaft holes respectively corresponding in position to the two shafts, but the present disclosure is not limited thereto. For example, in other embodiments of the present disclosure not shown in the drawings, the pivoting portion 2122 includes two shaft holes respectively arranged on two corners of the shielding board 212, and the chassis 11 has two shafts respectively corresponding in position to the two shaft holes.

Moreover, the abutting portion 23b is connected to the inner surface of the shielding board 212. Through the shape design of the abutting portion 23b, when the cable connector 200 is in the lock position, the shielding board 212 is configured to rotate relative to the chassis 11 by an angle within a predetermined angle range, so that the abutting portion 23b abuts against the unlock portion 201b to adjust the cable connector 200 from the lock position to unlock position.

Beneficial Effects of the Embodiments

In conclusion, in the electronic device provided by the present embodiment of the present disclosure, the unlocking cover can be used as a protective cover by being fastened to the chassis, and the unlocking cover can be used as a tool for detaching the cable connector from the main body (i.e., the unlocking cover can be used to adjust the cable connector from the lock position to the unlock position), thereby facilitating connection or separation between the main body (e.g., the connector) and the cable connector.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An electronic device, comprising:
a main body including:
a chassis surroundingly defining an accommodating space, wherein the chassis has an opening in spatial communication with the accommodating space; and
a connector arranged in the accommodating space, wherein the connector corresponds in position to the opening for insertion of a cable connector; and
an unlocking cover having a shield, at least one assembling portion that extends from the shield, and at least one abutting portion that extends from an inner surface of the shield, wherein the unlocking cover is configured to be detachably fastened to the chassis through the at least one assembling portion, so that the shield covers at least part of the opening, and at least part of the at least one abutting portion is arranged in the accommodating space of the chassis;
wherein, when the cable connector is inserted into and locked to the connector in a lock position, the unlocking cover is capable of unlocking the cable connector from the connector by being manipulated to enable the at least one abutting portion to abut against at least one unlock portion of the cable connector so as to adjust the cable connector to move from the lock position to an unlock position for separating from the connector;
wherein a quantity of the at least one abutting portion is two, the two abutting portions are spaced apart from each other, and a quantity of the at least one unlock portion is two, and wherein, when the cable connector is in the lock position, the unlocking cover is configured to clamp the two unlock portions of the cable connector through the two abutting portions so as to adjust the cable connector from the lock position to the unlock position.

2. The electronic device according to claim 1, wherein the shield has a baffle and a shielding board that is connected to the baffle, and the at least one assembling portion extends from the baffle, and wherein a distal end of the at least one abutting portion away from the shielding board is spaced apart from an inner surface of the shielding board by a triggering height is within a range from 3.5 mm to 9 mm.

3. The electronic device according to claim 2, wherein the triggering height corresponding to any one of the two abutting portions is within a range from 4 mm to 9 mm.

4. The electronic device according to claim 3, wherein the shielding board has at least one notch, and each of the two abutting portions has a pressing segment that extends from the inner surface of the shielding board toward the at least one notch, and a manipulation segment that extends from the pressing segment to pass through the at least one notch, and wherein, when the cable connector is in the lock position and the unlocking cover is disposed on the chassis, the manipulation segments of the two abutting portions are configured to be pressed to move along a direction toward each other, so that the pressing segments of the two abutting portions clamp the two unlock portions.

5. The electronic device according to claim 3, wherein, when the cable connector is inserted into the connector and the unlocking cover is fastened to the chassis, the two abutting portions are arranged in the accommodating space and clamp the two unlock portions so as to have the cable connector maintained at the unlock position.

6. The electronic device according to claim 3, wherein the shielding board has a pivoting portion that is arranged away from the baffle and that is pivotally connected to the chassis, and wherein, when the cable connector is in the lock position, the shielding board is configured to be rotated relative to the chassis by an angle within a predetermined angle range, so that the two abutting portions clamp the two unlock portions.

7. The electronic device according to claim 2, wherein a quantity of the at least one abutting portion is one, and the triggering height corresponding to the abutting portion is within a range from 3.5 mm to 5 mm, and wherein a quantity of the at least one unlock portion is one, and when the cable connector is in the lock position, the unlocking cover is configured to abut against the unlock portion of the cable connector through the abutting portion so as to adjust the cable connector from the lock position to the unlock position.

8. The electronic device according to claim 7, wherein, when the cable connector is inserted into the connector and the unlocking cover is fastened to the chassis, the abutting portion is arranged in the accommodating space and abuts against the unlock portion so as to have the cable connector maintained at the unlock position.

9. The electronic device according to claim 7, wherein the shielding board has a pivoting portion that is arranged away from the baffle and that is pivotally connected to the chassis, and wherein, when the cable connector is in the lock position, the shielding board is configured to be rotated relative to the chassis by an angle within a predetermined angle range, so that the abutting portion abuts against the unlock portion.

10. The electronic device according to claim 1, wherein the at least one unlock portion and a portion of the main body adjacent thereto have an operation distance therebetween that is within a range from 1 mm to 8 mm.

11. The electronic device according to claim 10, wherein a quantity of the at least one unlock portion is one, the unlock portion is arranged on one side of the cable connector adjacent to the opening, and the operation distance is within a range from 1 mm to 3 mm.

12. The electronic device according to claim 10, wherein a quantity of the at least one unlock portion is two, the two unlock portions are respectively arranged on two opposite sides of the cable connector, and the operation distance corresponding to any one of the two unlock portions is within a range from 1 mm to 4 mm.

13. An unlocking cover of an electronic device, comprising:

a shield having a baffle and a shielding board that is connected to the baffle;

at least one assembling portion extending from the baffle; and at least one abutting portion extending from an inner surface of the shield, wherein a distal end of the at least one abutting portion away from the shielding board is spaced apart from an inner surface of the shielding board by a triggering height;

wherein a quantity of the at least one abutting portion is two, the two abutting portions are spaced apart from each other, and the triggering height corresponding to any one of the two abutting portions is within a range from 4 mm to 9 mm.

14. The unlocking cover according to claim 13, wherein the shielding board has at least one notch, and each of the two abutting portions has a pressing segment that extends from the inner surface of the shielding board toward the at least one notch and a manipulation segment that extends from the pressing segment to pass through the at least one notch, and wherein the manipulation segments of the two abutting portions are configured to be pressed to move along a direction toward each other so as to reduce a distance between the pressing segments of the two abutting portions.

15. The unlocking cover according to claim 13, wherein the two abutting portions are connected to the inner surface of the shielding board in an upright manner, and a distance between the two abutting portions is maintained at a constant value.

16. The unlocking cover according to claim 13, wherein the shielding board has a pivoting portion arranged away from the baffle.

17. An unlocking cover of an electronic device, comprising:

a shield having a baffle and a shielding board that is connected to the baffle;

at least one assembling portion extending from the baffle; and at least one abutting portion extending from an inner surface of the shield, wherein a distal end of the at least one abutting portion away from the shielding board is spaced apart from an inner surface of the shielding board by a triggering height that is within a range from 3.5 mm to 9 mm, wherein the shielding board has a pivoting portion arranged away from the baffle.

18. The unlocking cover according to claim 17, wherein a quantity of the at least one abutting portion is one, the triggering height corresponding to the abutting portion is within a range from 3.5 mm to 5 mm.

19. The unlocking cover according to claim 18, wherein the abutting portion extends from the inner surface of the shielding board to protrude from an end edge of the shielding board arranged away from the baffle.

* * * * *